(12) United States Patent
Rinella et al.

(10) Patent No.: US 7,169,650 B2
(45) Date of Patent: Jan. 30, 2007

(54) SEMI-SOLID METAL INJECTION METHODS FOR ELECTRONIC ASSEMBLY THERMAL INTERFACE

(75) Inventors: Agostino C. Rinella, DuPont, WA (US); Paul A. Koning, Chandler, AZ (US)

(73) Assignee: Intel Corporation, Santa, CA (US)

( * ) Notice: Subject to any disclaimer, the term of this patent is extended or adjusted under 35 U.S.C. 154(b) by 0 days.

(21) Appl. No.: 10/909,206

(22) Filed: Jul. 30, 2004

(65) Prior Publication Data

US 2005/0006757 A1    Jan. 13, 2005

Related U.S. Application Data

(62) Division of application No. 10/096,776, filed on Mar. 12, 2002, now Pat. No. 6,787,899.

(51) Int. Cl.
*H01L 23/18* (2006.01)
*H01L 23/36* (2006.01)

(52) U.S. Cl. ............... 438/119; 438/122; 257/E23.109

(58) Field of Classification Search ............... 438/118, 438/119, 122; 257/E23.107, E23.109
See application file for complete search history.

(56) References Cited

U.S. PATENT DOCUMENTS

| | | | | |
|---|---|---|---|---|
| 3,902,544 | A | | 9/1975 | Flemings et al. .............. 164/71 |
| 4,661,173 | A | * | 4/1987 | Barajas et al. ................. 148/24 |
| 4,977,947 | A | | 12/1990 | Boswell et al. ............ 164/71.1 |
| 5,397,048 | A | * | 3/1995 | Konno et al. .................. 228/33 |
| 5,413,644 | A | | 5/1995 | Marder et al. ............... 148/420 |
| 5,690,890 | A | * | 11/1997 | Kawashima et al. ........ 420/559 |
| 5,706,579 | A | | 1/1998 | Ross ............................ 29/840 |
| 5,772,101 | A | * | 6/1998 | Nishimura et al. ............ 228/37 |
| 5,909,057 | A | | 6/1999 | McCormick et al. ........ 257/704 |
| 6,135,196 | A | | 10/2000 | Kono .......................... 164/113 |
| 6,151,198 | A | | 11/2000 | Prater et al. .............. 360/265.7 |
| 6,194,782 | B1 | | 2/2001 | Katchmar .................... 257/738 |
| 6,309,908 | B1 | | 10/2001 | Sarihan et al. .............. 438/106 |
| 6,368,704 | B1 | | 4/2002 | Murata et al. .............. 428/323 |
| 6,392,890 | B1 | * | 5/2002 | Katchmar .................... 361/705 |
| 6,396,136 | B2 | | 5/2002 | Kalidas et al. .............. 257/691 |
| 6,432,749 | B1 | | 8/2002 | Libres ......................... 438/122 |
| 6,458,628 | B1 | | 10/2002 | Distefano et al. ........... 438/126 |
| 6,504,096 | B2 | | 1/2003 | Okubora .................... 174/52.2 |
| 6,529,027 | B1 | | 3/2003 | Akram et al. ............... 324/758 |
| 6,562,662 | B2 | | 5/2003 | Shishido et al. ............ 438/125 |
| 6,624,224 | B1 | * | 9/2003 | Misra ......................... 524/404 |
| 6,812,548 | B2 | * | 11/2004 | Dias et al. .................. 257/620 |
| 6,853,558 | B1 | * | 2/2005 | Dixon ......................... 361/761 |
| 2002/0141155 | A1 | | 10/2002 | Pinneo ........................ 361/688 |

* cited by examiner

*Primary Examiner*—Carl Whitehead, Jr.
*Assistant Examiner*—Jennifer M. Dolan
(74) *Attorney, Agent, or Firm*—Schwegman, Lundberg, Woessner & Kluth, P.A.

(57) ABSTRACT

To accommodate high power densities associated with high performance integrated circuits, an integrated circuit package includes a heat-dissipating structure in which heat is dissipated from a surface of a die to an integrated heat spreader (IHS) through a high capacity thermal interface formed of metal that has been injected in a semi-solid state. In one embodiment, vacuum and a shear-controlled viscosity enable semi-solid metallic material to fill a narrow chamber between the die surface and a specially shaped mold plate that doubles as an IHS, without inducing voids in the solidified metal. In another embodiment, an injection machine is disclosed. Methods of fabrication, as well as application of the package to an electronic assembly and to an electronic system, are also described.

25 Claims, 13 Drawing Sheets

SEMI-SOLID METAL INJECTION METHODS FOR ELECTRONIC ASSEMBLY THERMAL INTERFACE

DIVISIONAL APPLICATION

The present application is a divisional of application U.S. patent application Ser. No. 10/096,776, filed on Mar. 12, 2002, now issued as U.S. Pat. No. 6,787,899, which is incorporated herein by reference.

TECHNICAL FIELD

Embodiments of the inventive subject matter relate generally to electronics packaging and, more particularly, to an electronic assembly that includes an integrated circuit package comprising a high capacity thermal interface between the integrated circuit and a heat spreader to dissipate heat generated in a high performance integrated circuit, and to manufacturing methods related thereto.

BACKGROUND INFORMATION

Integrated circuits (IC's) are typically assembled into packages by physically and electrically coupling them to a substrate made of organic or ceramic material. One or more IC packages can be physically and electrically coupled to a printed circuit board (PCB) to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3(Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of IC's on substrates, where each new generation of packaging must provide increased performance, particularly in terms of an increased number of components and higher clock frequencies, while generally being smaller or more compact in size. As the density and clock frequency of IC's increase, they accordingly generate a greater amount of heat. However, the performance and reliability of IC's are known to diminish as the temperature to which they are subjected increases, so it becomes increasingly important to adequately dissipate heat from IC environments, including IC packages.

An IC substrate may comprise a number of metal layers selectively patterned to provide metal interconnect lines (referred to herein as "traces"), and one or more electronic components mounted on one or more surfaces of the substrate. The electronic component or components are functionally connected to other elements of an electronic system through a hierarchy of electrically conductive paths that include the substrate traces. The substrate traces typically carry signals that are transmitted between the electronic components, such as IC's, of the system. Some IC's have a relatively large number of input/output (I/O) terminals (also called "lands"), as well as a large number of power and ground terminals or lands.

As the internal circuitry of IC's, such as processors, operates at higher and higher clock frequencies, and as IC's operate at higher and higher power levels, the amount of heat generated by such IC's can increase their operating temperature to unacceptable levels.

For the reasons stated above, and for other reasons stated below which will become apparent to those skilled in the art upon reading and understanding the present specification, there is a significant need in the art for apparatus and methods for packaging an IC on a substrate that minimize heat dissipation problems associated with high clock frequencies and high power densities.

DETAILED DESCRIPTION

In the following detailed description of embodiments of the invention, reference is made to the accompanying drawings that form a part hereof, and in which is shown by way of illustration, but not of limitation, specific embodiments of the invention. These embodiments are described in sufficient detail to enable those skilled in the art to understand and implement them, and it is to be understood that other embodiments may be utilized and that structural, mechanical, compositional, electrical, and procedural changes may be made without departing from the spirit and scope of the present disclosure. Such embodiments of the inventive subject matter may be referred to, individually and/or collectively, herein by the term "invention" merely for convenience and without intending to voluntarily limit the scope of this application to any single invention or inventive concept if more than one is in fact disclosed. The following detailed description is, therefore, not to be taken in a limiting sense, and the scope of embodiments of the present disclosure is defined only by the appended claims.

The inventive subject matter, in at least one embodiment, provides a solution to thermal dissipation problems that are associated with prior art packaging of integrated circuits that have high circuit density and that operate at high clock speeds and high power levels, by employing a high capacity thermal material as a thermal interface between one or more IC's and a heat spreader. Various embodiments are illustrated and described herein.

In one embodiment, a front surface of an IC die is flip-chip mounted to an organic land grid array (OLGA) substrate using "controlled collapse chip connect" (C4) technology. A high capacity thermal interface material is injected, in semi-solid form, between the back surface of the die and an integrated heat spreader (IHS). In one embodiment, the high capacity thermal material comprises a eutectic solder alloy. A shaped mold plate, which doubles as the IHS, channels the semi-solid metallic material into a narrow chamber between the die surface and the mold plate. In one embodiment, a solder injection machine uses pressure, vacuum, and a viscosity-shearing mechanism to quickly inject the semi-solid metallic material without inducing voids in the metal. Other embodiments include methods of fabricating the mold plate, methods of operating the injection machine, as well as application of the electronic assembly to an electronic system.

Figure 1:
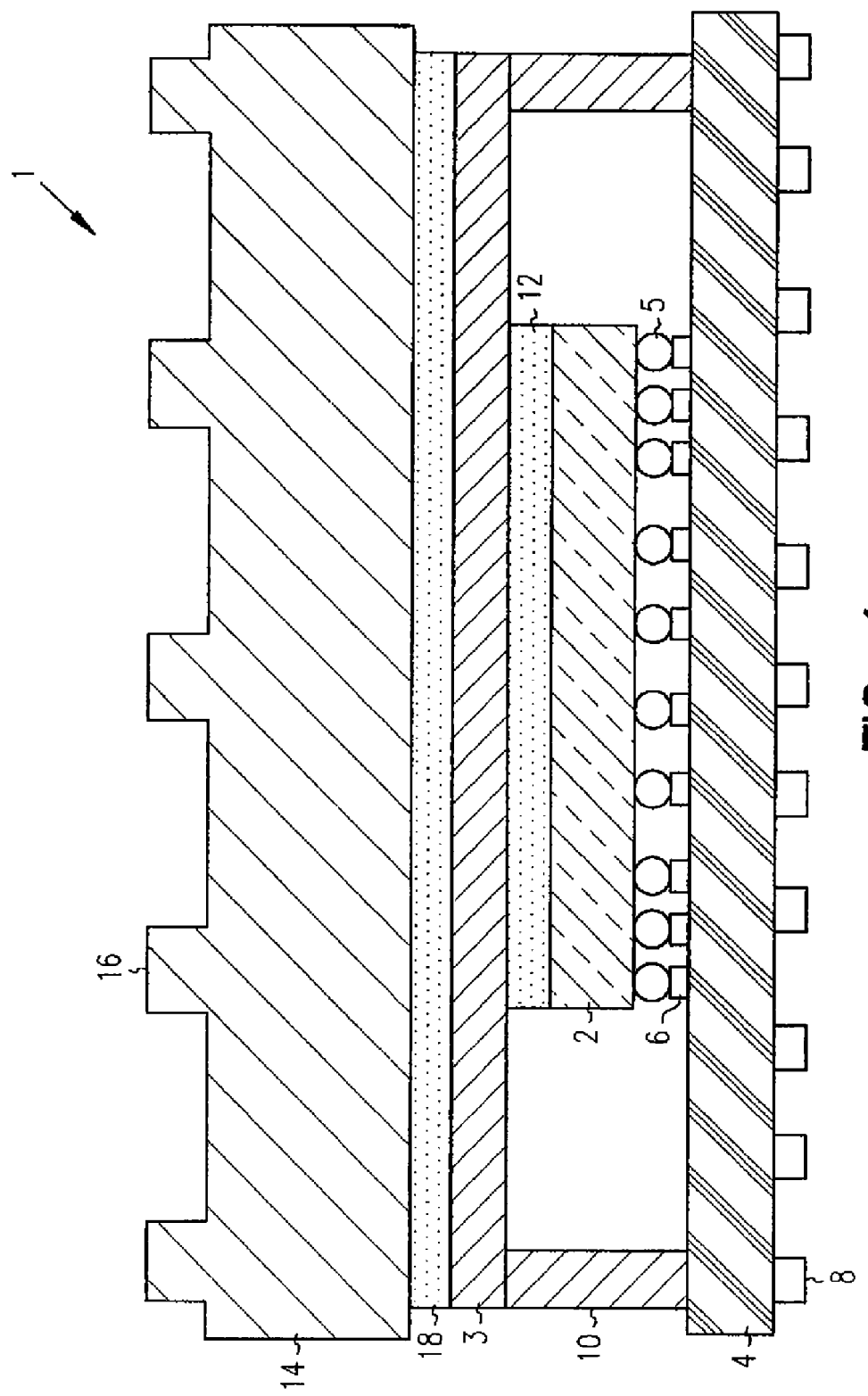
FIG. 1 illustrates a cross-sectional representation of a prior art IC package.

FIG. 1 illustrates a cross-sectional representation of a prior art IC package 1. IC package 1 represents a typical prior art structure that includes an IC die 2 mounted in "flip-chip" orientation with its lands (not shown) facing downward to couple with corresponding lands 6 on the upper surface of a substrate 4 through solder balls or bumps 5. Substrate 4 can be a one-layer board or a multi-layer board, and it can include additional lands 8 on its opposite surface for mating with additional packaging structure (not shown).

Die 2 generates heat from internal structure, including wiring traces, that is located near its lower surface; however, most of the heat is dissipated through its upper surface. Heat that is concentrated within die 2 is dissipated to a large surface that is in contact with die 2 in the form of an integrated heat spreader (IHS) 2 that is typically formed of metal such as copper or aluminum. IHS 2 typically includes a support member 10 that extends downward to make physical and thermal contact with the upper surface of substrate 4 through a thermally conductive adhesive (not shown).

To improve the thermal conductivity between die 2 and IHS 3, a thermal interface material 12 is often provided between die 2 and IHS 3. The thermal interface material 12 typically is a thermal gel or grease containing metal particles.

To further dissipate heat from IHS 3, a heat sink 14 (optionally having heat fins 16) is often coupled to IHS 3 to dissipate heat into the ambient environment. For increased thermal conductivity between IHS 3 and heat sink 14, a thermal interface material 18 is often provided between IHS 3 and heat sink 14. Like thermal interface material 12, thermal interface material 18 is typically a thermal gel or grease containing metal particles.

The IC package 1 of FIG. 1 is for most purposes no longer capable of meeting the thermal-dissipating requirements of today's high performance electronic assemblies. While the silicon die provides some lateral heat spreading, it is insufficient to appreciably reduce the peak temperature(s). Even the high thermal conductivity of copper (which is greater than three times that of silicon) is insufficient to handle the hot spots. If existing thermal dissipation structure is incapable of dissipating sufficient heat to maintain the die peak temperature below a specified value, the performance of the electronic assembly must be throttled back by reverting to a temperature-dependent processor power control process. Otherwise, the electronic assembly could malfunction or experience a catastrophic failure. Thus, with increased heat dissipation requirements for electronic assemblies, it has become necessary to substantially improve the performance of thermal interface materials and integrated heat spreaders.

Figure 2:
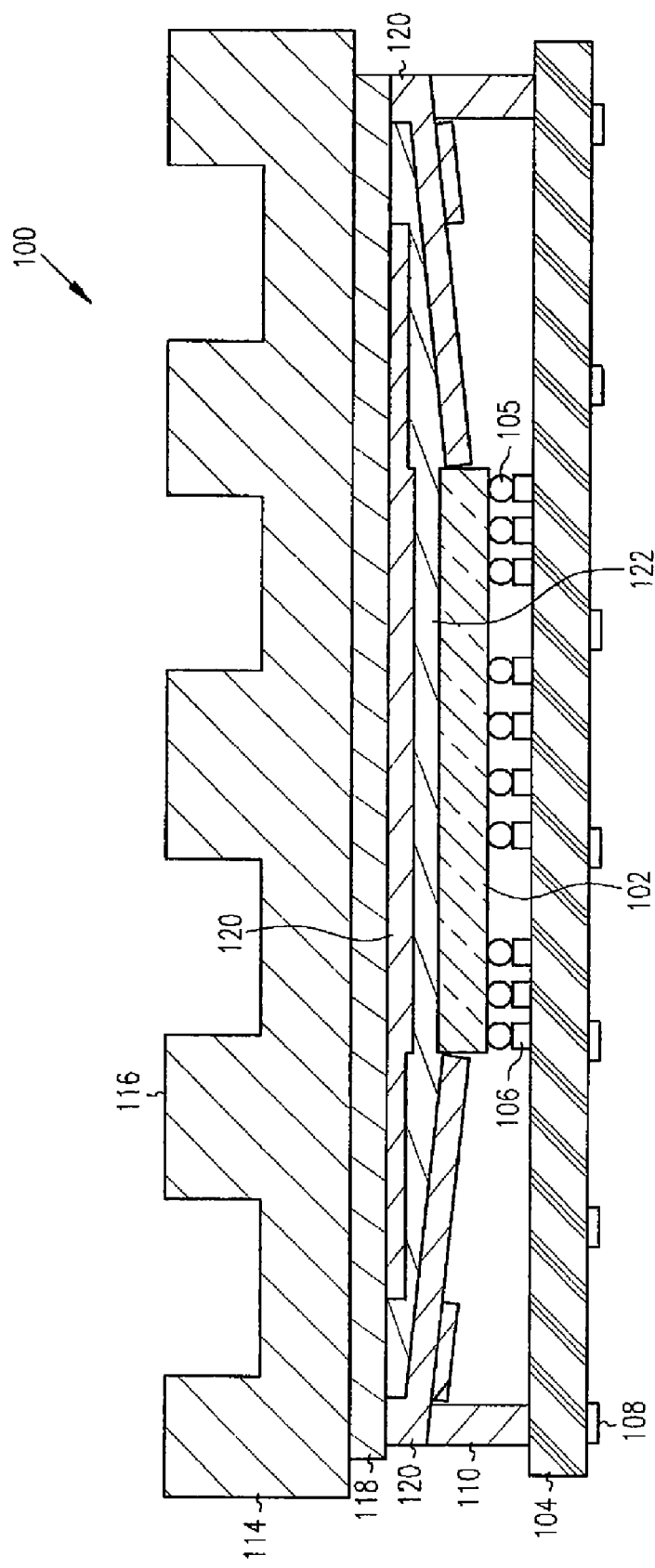
FIG. 2 illustrates a cross-sectional representation of an IC package with a high capacity thermal interface, in accordance with one embodiment of the invention.

FIG. 2 illustrates a cross-sectional representation of an IC package 100 with a high capacity thermal interface 122, in accordance with one embodiment of the invention. Thermal interface 122 comprises a thermally conductive material that has been formed between die 102 and a combination mold plate and integrated heat spreader (IHS) 120 that will be described in greater detail regarding FIGS. 3–5.

Still referring to FIG. 2, some characteristics of thermal interface 122 will now be discussed. In one embodiment, thermal interface 122 comprises a eutectic solder alloy of approximately 63% tin and 37% lead. However, the specific proportions of tin and lead are not critical, and different proportions can be used. In addition, many different alloys can be used. In general, thermal interface 122 comprises an alloy from the group consisting essentially of tin, lead, silver, gold, nickel, copper, antimony, zinc, indium, bismuth, and gallium.

The term "essentially", as used herein, means more than a trace amount, i.e. more than 2% by weight.

The use of metal within thermal interface 122 provides a significantly greater thermal transfer compared with thermal gels and thermal greases containing metal particles, as exemplified by thermal interface 12 of the prior art IC package 1 of FIG. 1. However, alloys such as those mentioned above cannot be inserted in liquid form between die 102 and IHS 120 without producing significant voids resulting from the formation of dendrites and gas entrainment upon cooling. The presence of these voids significantly reduces the thermal transfer properties of the thermal interface material.

To provide a thermal interface 122 formed of a metallic material having excellent thermal transfer properties, and yet with minimal voids, thermal interface 122 is injected in a semi-solid or thixotropic state, according to one embodiment.

Thixotropic metal forming processes are also known in the art as rheocasting, semi-solid forging, semi-solid casting, semi-solid forming, slurry-casting, pseudo-plastic casting, thixoforming, thixocasting, or thixomolding. According to this casting method, when certain metal alloys are agitated, they exhibit a significantly low shear strength even when they include a relatively high fraction of solid material. Further, as these alloys cool during solidification from a semi-solid state to a solid state, the resulting solid has a special, non-dendritic, spheroidal microstructure. The non-dendritic microstructure of semi-solid metal slurries is described in U.S. Pat. No. 3,902,544.

As used in the metal casting industry, thixoforming provides several significant advantages over ordinary casting methods, including lower operating temperatures, better laminar cavity fill with less gas entrainment, and less solidification shrinkage. Thixomolding is a known method of casting machine parts using magnesium and zinc alloys, typically utilizing very large and complex casting machinery.

To channel the semi-solid thermally conductive material into the space between die 102 and IHS 120, IHS 120 is specially formed, in one embodiment, as will be described in greater detail regarding FIGS. 3–5

IC package 100 includes die 102 mounted to lands 106 on the upper surface of substrate 104 through solder balls or bumps 105. Substrate 104 can be a one-layer board or a multi-layer board, and it can include additional lands 108 on its opposite side for mating with additional packaging structure (not shown). In one embodiment, substrate 104 is an organic land grid array (OLGA) substrate; however, the embodiments of the invention are not limited to use with an OLGA substrate, and any other type of substrate can be employed. The IC package 100 illustrated in FIG. 2 can form part of electronic assembly 504 shown in FIG. 17 (to be discussed later). Die 102 can be of any type. In one embodiment, die 102 is a processor.

While a BGA arrangement is illustrated in FIG. 2 for coupling die 102 to substrate 104, the embodiments of the invention are not limited to use with a BGA arrangement, and it can be used with any other type of packaging technology. Further, the embodiments of the invention are not to be construed as limited to use in C4 packages, and they can be used with any other type of IC package where the herein-described features of the disclosure provide an advantage.

Die 102 dissipates heat through its upper surface through high capacity thermal interface 122 to combination mold plate and integrated heat spreader (IHS) 120. IHS 120 typically includes a wall or support member 110 that extends downward to make physical and thermal contact with the upper surface of substrate 104 through a thermally conductive adhesive (not shown).

To further dissipate heat from IHS 120, a heat sink 114 (optionally having heat fins 116) is often coupled to IHS 120 to dissipate heat into the ambient environment. Heat sink 114 can be of any suitable shape, material, and size. For increased thermal conductivity between IHS 120 and heat sink 114, a thermal interface material 118 can be provided between IHS 120 and heat sink 114. In one embodiment, thermal interface material 118 can comprise a thermal gel or grease containing metal particles.

Figure 3:
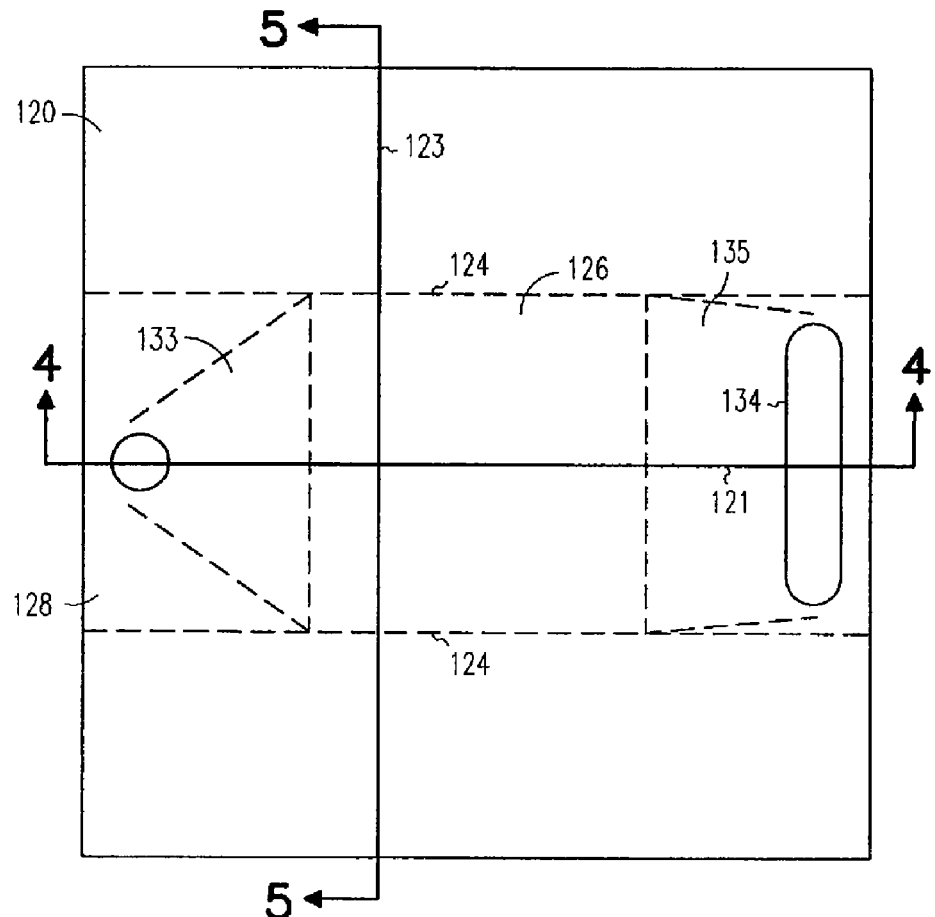
FIG. 3 illustrates a top view of a combination mold plate and integrated heat spreader (IHS), in accordance with one embodiment of the invention.

FIG. 3 illustrates a top view of a combination mold plate and integrated heat spreader (IHS) 120, in accordance with one embodiment of the invention. IHS 120 comprises a relatively thin sheet of thermally conductive material. In one embodiment, copper or a copper alloy in a square shape of approximately 37 millimeters (mm) per side and having a thickness of approximately 1.5 mm is used. The copper IHS 120 can be plated with a relatively thin layer of nickel. IHS 120 comprises a substantially planar upper surface. IHS 120 comprises a rectangular die-mounting or die-fitting area 126 on its lower surface, i.e. the surface away from the viewer. In one embodiment, die-fitting 126 area is a square of approximately 15 mm per side to accommodate a die of equivalent dimensions.

IHS 120 further comprises a channel 128 formed across one dimension of IHS 120 and having a width dimension substantially equal to the width dimension of the die-fitting area 126. Channel 128 can be formed in IHS 120 in any suitable manner. In one embodiment, channel 128 is formed by a metal rolling operation, leaving channel boundaries 124 (see also FIG. 5) in the lower surface of IHS 120. Channel 128 could also be formed by coining, forging, or machining.

Still referring to FIG. 3, IHS 120 further comprises an inlet 132 and an outlet 134, both of which are apertures in IHS 120. In the embodiment shown, inlet 132 is circular, and outlet 134 is oblong; however, these shapes are not critical, and any suitable shapes can be used.

IHS 120 further comprises an inlet ramp 133 extending from inlet 132 to die-fitting area 126, and an outlet ramp 135 extending from die-fitting area 126 to outlet 134. Inlet ramp 133 and outlet ramp 135 are better seen in FIG. 4, which will now be described.

Figure 4:
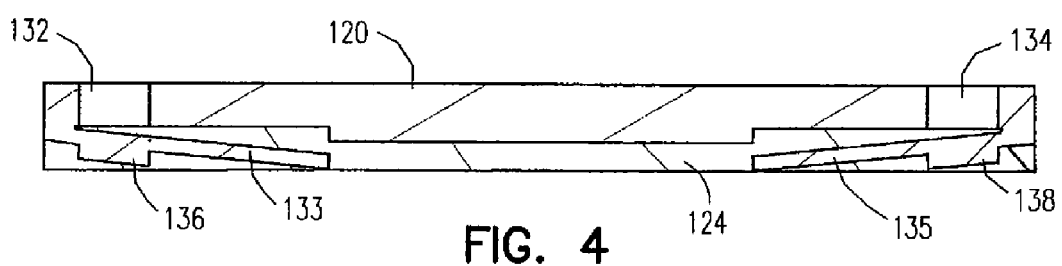
FIG. 4 illustrates a cross-sectional representation of the combination mold plate and IHS shown in FIG. 3, taken along dashed line 121 of FIG. 3.

FIG. 4 illustrates a cross-sectional representation of the combination mold plate and IHS 120 shown in FIG. 3, taken along dashed line 121 of FIG. 3. Inlet ramp 133 extends downwardly from inlet 132 to die-fitting area 126, and outlet ramp 135 extends upwardly from die-fitting area 126 to outlet 134. Element 136 is a punched formation formed when inlet 132 was partially punched in the IHS 120 plate; similarly, element 138 is a punched formation formed when outlet 134 was partially punched in the IHS 120 plate. Elements 136 and 138 would not be present if inlet 132 and outlet 134 were formed via other fabrication processes such as drilling or molding. Further details concerning the fabrication of IHS 120 are provided later regarding FIGS. 8–16.

Figure 5:
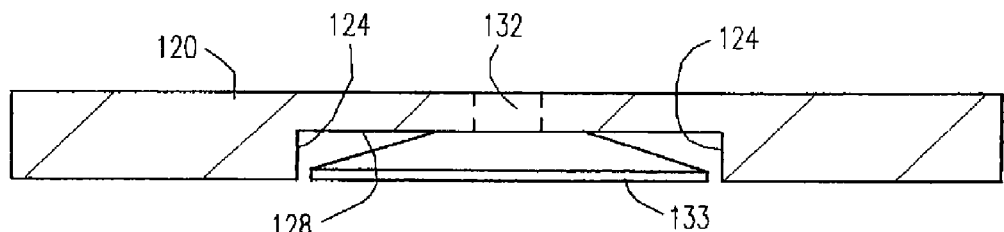
FIG. 5 illustrates a cross-sectional representation of the combination mold plate and IHS shown in FIG. 3, taken along dashed line 123 of FIG. 3.

FIG. 5 illustrates a cross-sectional representation of the combination mold plate and IHS 120 shown in FIG. 3, taken along dashed line 123 of FIG. 3. The view in FIG. 5 is looking towards inlet ramp 133, which is descending from inlet 132 towards the viewer. Also seen in FIG. 5 are the channel boundaries 124 of channel 128 in the bottom surface of IHS 120. The depth of channel 128 can vary, but in general it should be at least as deep as the desired spacing between the top of the die and the bottom surface of the IHS, e.g. between the top of die 240 and the bottom surface of IHS 230 in FIG. 6, which is discussed immediately below, because the sidewalls of channel 128 serve as mold surfaces to confine semi-solid metallic material when it is injected into the space 236 between the top of die 240 and the bottom surface of IHS 230.

Figure 6:
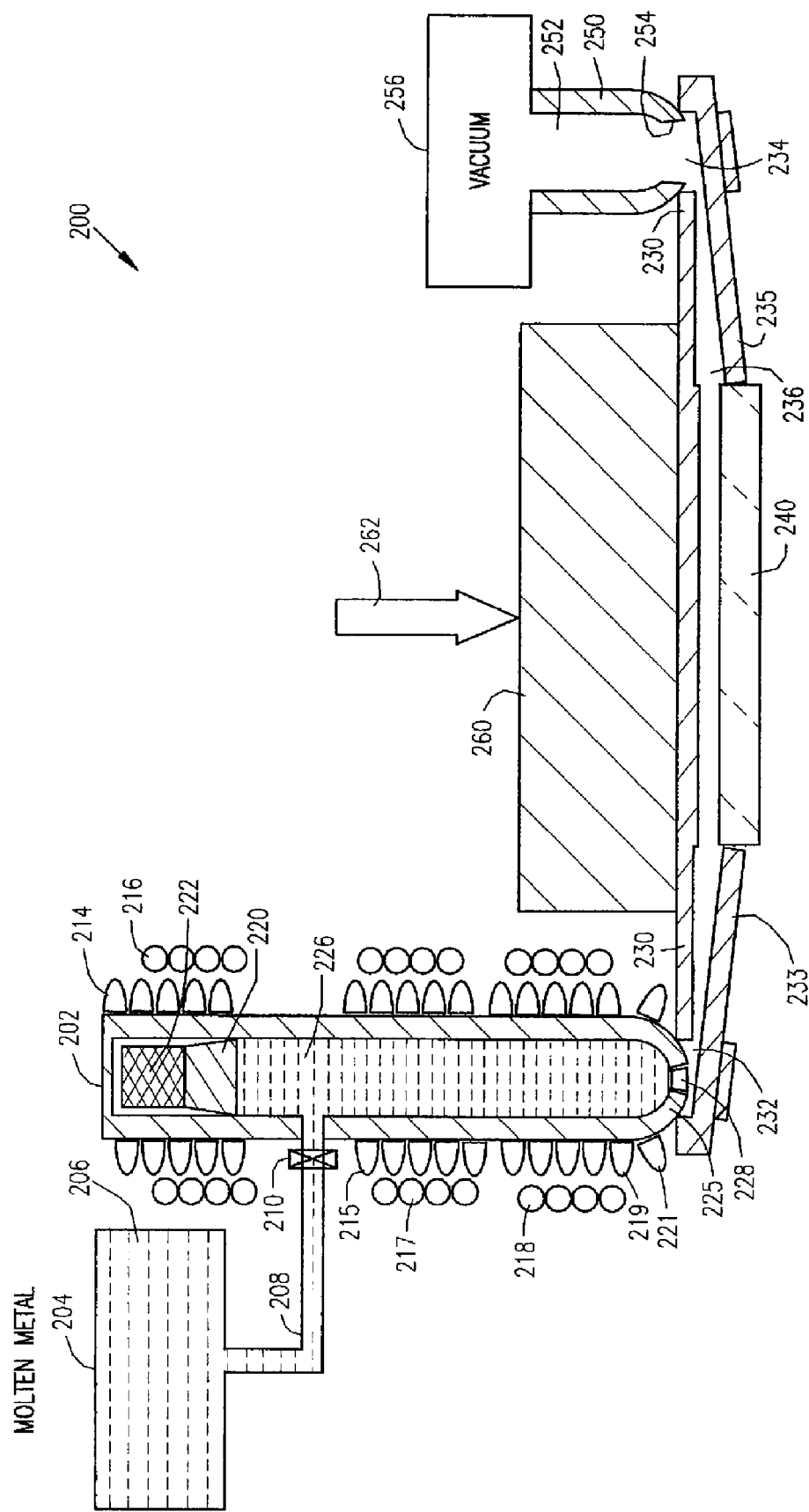
FIG. 6 illustrates a cross-sectional representation of a thermal interface material (TIM) injection machine, in accordance with one embodiment of the invention, and having a piston in a first position.

FIG. 6 illustrates a cross-sectional representation of a thermal interface material (TIM) injection machine 200, in accordance with one embodiment of the invention, and having a piston 220 in a first position.

Injection machine 200 comprises a heated chamber 204 of molten metallic material 206. A feed pipe 208 is coupled to reservoir 202 through a control valve 210.

Reservoir 202 has a tubular shape and contains semi-solid metallic material 226. At the lower end of reservoir 202 is an injection nozzle 225.

Reservoir 202 also comprises a plunger or piston 220 having a leading face that conforms to the circular cross-section of reservoir 202 and further having an impeller or driver 222 formed of ferromagnetic material. In FIG. 6, piston 220 is shown in a raised position, ready to be impelled downward. An electromagnetic shooting coil 216 surrounds reservoir 202. When shooting coil 216 is actuated, an electromagnetic field is created that quickly impels driver 222 and piston 220 downward.

Reservoir 202 further comprises a suitable agitator to shear and stir the semi-solid metallic material 226 to the desired thixotropic viscosity. In one embodiment, the agitator comprises one or more electromagnetic stirring coils 217 and 218 surrounding reservoir 202. An alternative stirring mechanism could be utilized, such as a screw or auger.

Reservoir 202 also comprises a suitable heating element to maintain the semi-solid metallic material 226 in a desired semi-solid state. In one embodiment, heating coils 214, 215, and 219 surround reservoir 202. Heating coils 214, 215, and 219 can be induction heating coils or resistance heating bands.

One of ordinary skill can determine a suitable approximate operating temperature range for the semi-solid metallic material 226 by consulting a phase diagram for the particular alloy. In general, one operates within a temperature range that provides a relatively greater proportion of solid material than liquid material, and one uses sufficient agitation to prevent the material from solidifying within the reservoir 202. In other words, the viscosity is controlled by controlling the temperature, using heating coils 214, 215, and 219, and by controlling the agitation, using stirring coils 217 and 218.

Surrounding injection nozzle 225 at the lower end of reservoir 202 is a suitable cooling element. In one embodiment, the cooling element comprises one or more water coils 221 into which water can be quickly introduced to form a temporary plug 228 of metal within the injection nozzle 225.

Injection machine 200 further comprises a vacuum chamber 250 having a vacuum nozzle 254 and an interior 252 coupled to a vacuum source 256. Vacuum can be provided at vacuum nozzle 254, either constantly or as controlled by a suitable actuator valve (not shown). In one embodiment, a vacuum of approximately 15 inches (38.1 centimeters) of mercury is used; however, the amount of vacuum is not critical and can be adjusted to suit specific fabrication requirements.

Injection machine 200 further comprises an IHS retention element 260 that is in kept in contact with the upper surface of combination mold plate and IHS 230 through the application of downward force as indicated by arrow 262.

IHS 230 can be of the same or similar design to IHS 120 shown in FIGS. 3–5. Thus IHS 230 has an inlet 232, an outlet 234, an inlet ramp 233, and an outlet ramp 235.

In preparation for a metal injection operation, IHS 230 is positioned adjacent to a die 240, leaving empty space 236 between them. This positioning can be done up-line from injection machine 200. A temporary jig (not shown) can be used, if necessary, to maintain die 240 the proper distance from IHS 230; alternatively, a suitable standoff could be fabricated from IHS 230 itself. The assembly is then moved to injection machine 200, where the IHS retention element 260 is lowered to hold down IHS 230.

IHS 230 and/or injection nozzle 225 and vacuum nozzle 254 are then subsequently moved relative to each other, so that injection nozzle 225 is adjacent to inlet 232, and vacuum nozzle 254 is adjacent to outlet 234. Which elements are moved with respect to each other is not essential, and in various embodiments, these elements can be moved relative to each other in any suitable manner. The injection of semi-solid metallic material into space 236 will now be described with reference to FIG. 7.

Figure 7:
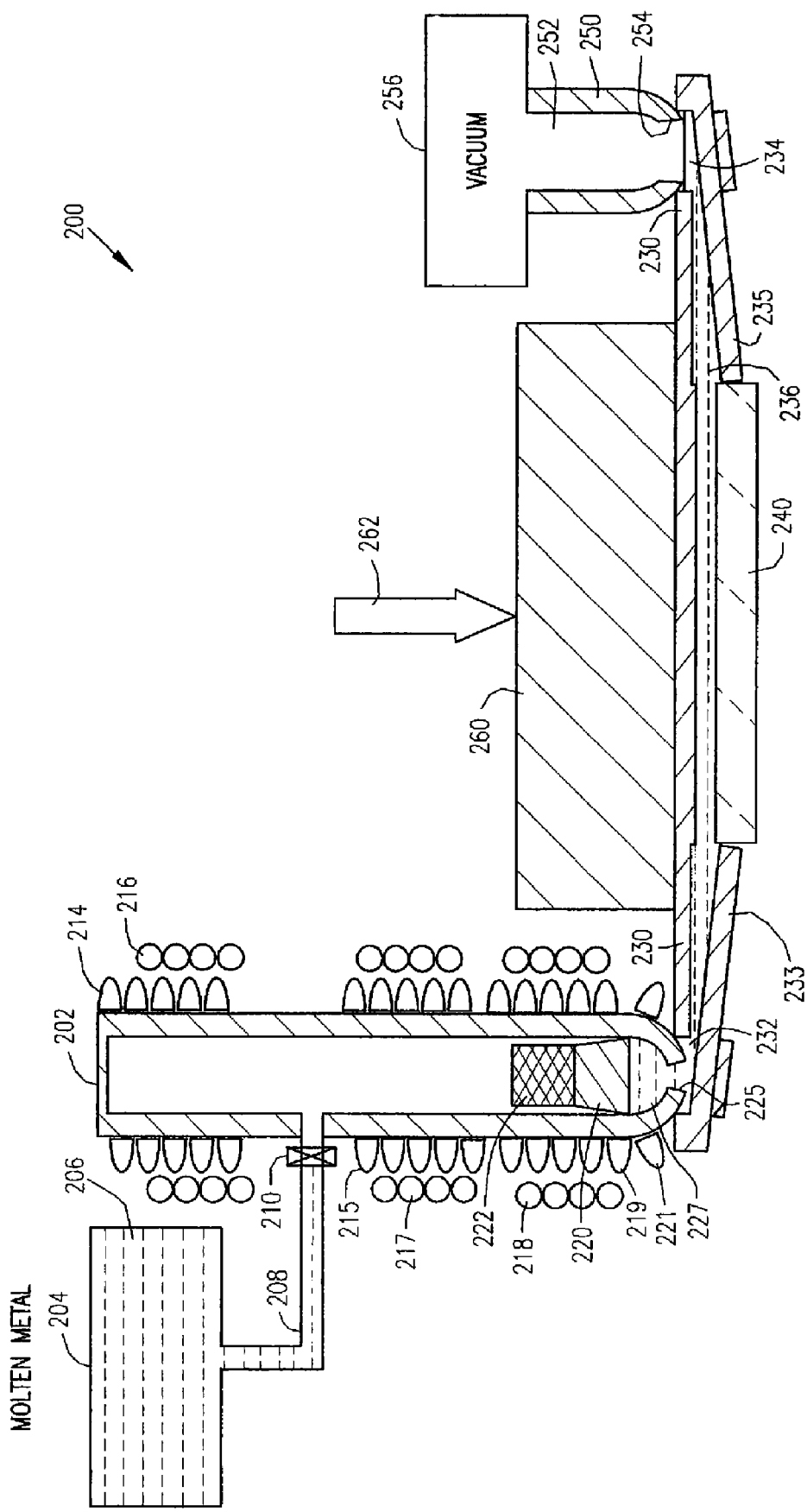
FIG. 7 illustrates a cross-sectional representation of a TIM injection machine, in accordance with one embodiment of the invention, and having a piston in a second position.

FIG. 7 illustrates a cross-sectional representation of a TIM injection machine 200, in accordance with one embodiment of the invention, and having a piston 220 in a second position.

To inject semi-solid metallic material into space 236 between IHS 230 and die 240, the following sequence of events occurs, not necessarily in the order given. Vacuum is turned on (in an embodiment wherein vacuum is turned on and off, as opposed to being constantly on) at vacuum nozzle 254 to lower the air pressure in the space 236 between die 240 and IHS 230. Stirring of semi-solid metallic material 226 (refer back to FIG. 6) within reservoir 202 is stopped.

Still referring to FIG. 7, cold water circulating in water coil 221 is stopped, and heating coils 219 near injection nozzle 225 are turned on, thus melting the temporary plug 228 (refer back to FIG. 6) residing in the opening of injection nozzle 225. In other embodiments, temporary plug 228 could be melted either by stopping the circulation of cold water in water coil 221 or by heating coils 219, but not necessarily both, depending upon the thermal characteristics of the injection nozzle 225 and the semi-solid metallic material within reservoir 202.

Still referring to FIG. 7, control valve 210 is closed, and shooting coil 216 is actuated, quickly forcing driver 222 of piston 220 downward through reservoir 202. This squirts semi-solid metallic material 227 through injection nozzle 225 into inlet 232 and into the space 236 between die 240 and IHS 230. The semi-solid metallic material is channeled and confined on the bottom by inlet ramp 233, the upper surface of die 240, and by outlet ramp 235. The semi-solid metallic material is confined on the top by combination mold plate and IHS 230, which is held down by IHS retention element 260.

The semi-solid metallic material quickly fills the space 236, aided by vacuum applied by vacuum source 256 through vacuum nozzle 254 adjacent to and in contact with outlet 234. In some embodiments, the vacuum can eliminate or reduce the need for fluxes, due to the superior wetting and flow characteristics provided by the vacuum.

The injected semi-solid metallic material cools quickly. In one embodiment, cooling can be hastened by cooling the IHS retention element 260. After cooling, the injected semi-solid metallic material has become a solidified thixotropic material.

The term "solidified thixotropic material", as used herein, means a solidified material that was in thixotropic state just prior to solidification and that exhibits a non-dendritic structure.

To complete the fill cycle, vacuum can be turned off to vacuum nozzle 254 (in an embodiment in which vacuum is controlled, as opposed to being on constantly), and water can be introduced to form another temporary plug 228 (refer to FIG. 6) of metal within the injection nozzle 225. Still referring to FIG. 7, injection nozzle 225 and vacuum nozzle 254 are withdrawn from IHS 230. IHS retention element 260 is withdrawn from the upper surface of IHS 230. The IC package assemblies in the fabrication line are then incremented by moving the current IC package assembly out and moving a new IC package assembly into the injection machine 200.

After injection, piston 220 is withdrawn upwards by reversing the shooting coil 216. After piston 220 passes pipe 208, control valve 210 is quickly reopened, and additional molten metallic material 206 is supplied into reservoir 202 from heated chamber 204. The cycle then starts over as shown in FIG. 6.

Figure 8:
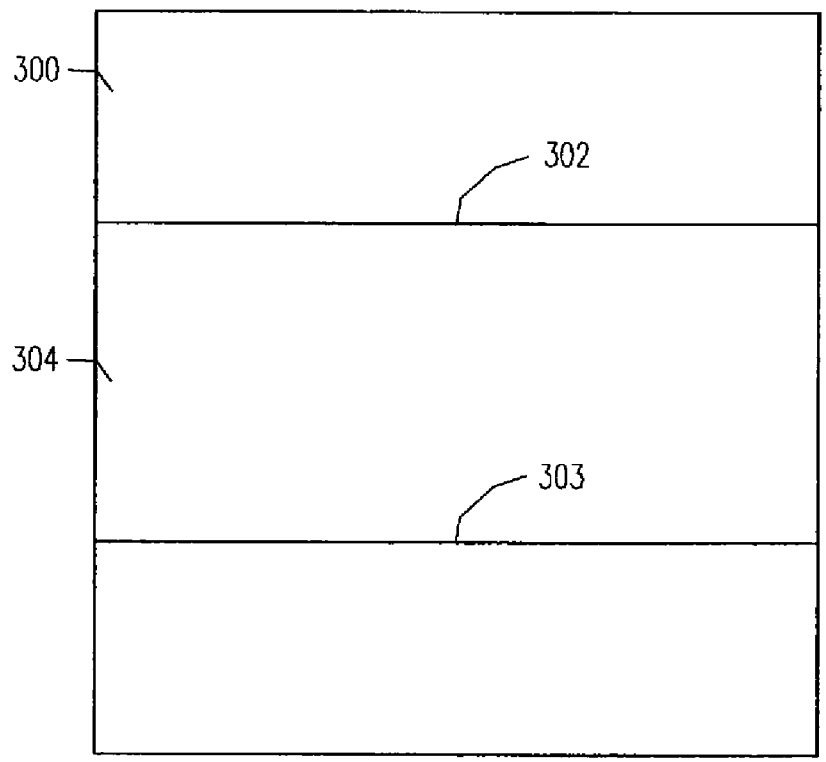
FIG. 8 illustrates a top view of a metal sheet having a central trough or channel, representing a stage in the fabrication of a combination IHS and mold plate, in accordance with one embodiment of the invention.

FIG. 8 illustrates a top view of a metal sheet having a central trough or channel 304, representing a stage in the fabrication of a combination IHS and mold plate 300, in accordance with one embodiment of the invention. In one embodiment, the metal sheet comprises copper or a copper alloy, and the metal sheet is approximately 1.5 mm in thickness and approximately 37 millimeters (mm) per side. However, the thickness and size are not at all critical, and many other dimensions could be used, depending upon the desired IC package geometry.

Channel 304 can be formed in any suitable manner. In one embodiment, channel 304 is formed by a metal rolling operation, leaving channel boundaries 302 and 303 in the surface of the plate that will become IHS 300. Channel 304 could also be formed in any other suitable manner, e.g. by coining, forging, or machining. As viewed in FIG. 8, channel 304 is lower than the region situated above channel boundary 302 or the region situated below channel boundary 303. The opposite side of the plate can be substantially planar.

Figure 9:
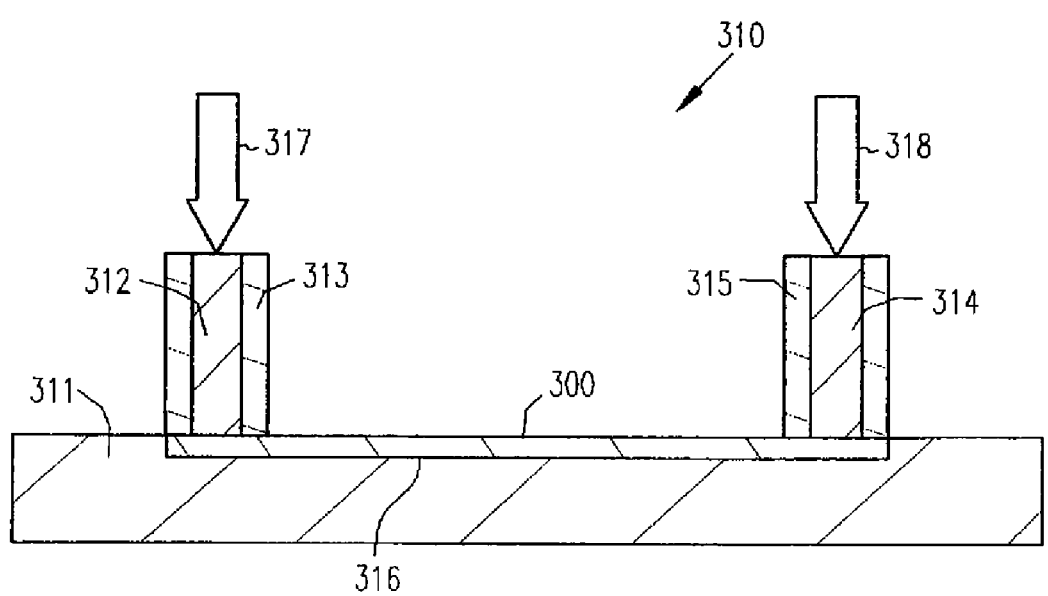
FIG. 9 illustrates a cross-sectional representation of a fabricating machine having metal punches in a first position relative to the partially fabricated IHS shown in FIG. 8, in accordance with one embodiment of the invention.

FIG. 9 illustrates a cross-sectional representation of a fabricating machine 310 having metal punches 312 and 314 in a first position relative to the partially fabricated IHS 300 shown in FIG. 8, in accordance with one embodiment of the invention.

The channeled metal sheet shown in FIG. 8 is inverted and placed onto the base 311 of fabricating machine 310. Base 311 has a cut-out section 316 for receiving partially fabricated IHS 300, including a raised portion (not seen) for supporting channel 304 (refer back to FIG. 8). Still referring to FIG. 9, base 311 can comprise a resilient material to absorb the force of punching forces applied to punches 312 and 314 in the direction of arrows 317 and 318, respectively; alternatively, base 311 can comprise cut-out sections (not shown) of the proper shape and depth to receive the partially punched segments 320 and 322 (refer to FIG. 10) when punches 312 and 314 are driven down. Punches 312 and 314 are contained within punch sleeves 313 and 315, respectively.

Figure 10:
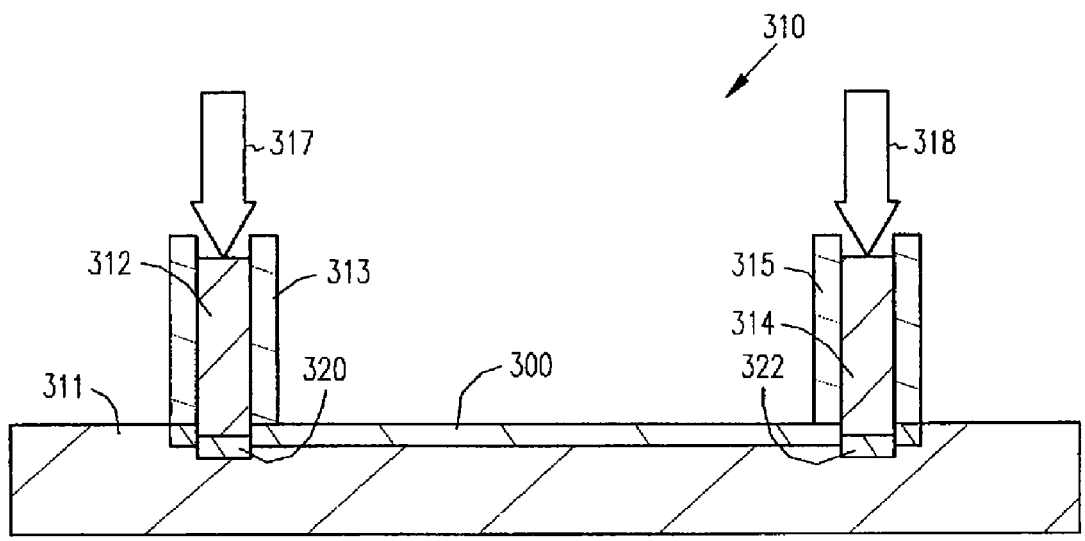
FIG. 10 illustrates a cross-sectional representation of a fabricating machine having metal punches in a second position relative to the partially fabricated IHS, in accordance with one embodiment of the invention.

FIG. 10 illustrates a cross-sectional representation of a fabricating machine 310 having metal punches 312 and 314 in a second position relative to partially fabricated IHS 300, in accordance with one embodiment of the invention. Punching forces in the direction indicated by arrows 317 and 318 are actuated to drive punches 312 and 314, respectively, into partially fabricated IHS 300. As a result, segments 320 and 322 are partially driven through by punches 312 and 314, respectively.

Figure 11:
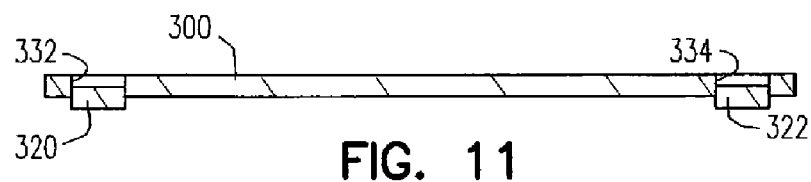
FIG. 11 illustrates a cross-sectional representation of a partially fabricated IHS, representing an intermediate stage in the fabrication of a combination mold plate and IHS, in accordance with one embodiment of the invention.

FIG. 11 illustrates a cross-sectional representation of a partially fabricated IHS 300, representing an intermediate stage in the fabrication of a combination mold plate and IHS 300, in accordance with one embodiment of the invention. As seen in FIG. 11, partially fabricated IHS 300 now comprises partial holes 332 and 334 in what is now the upper surface of partially fabricated IHS 300. Partial holes 332 and 334 are better viewed in FIG. 12, which will now be described.

Figure 12:
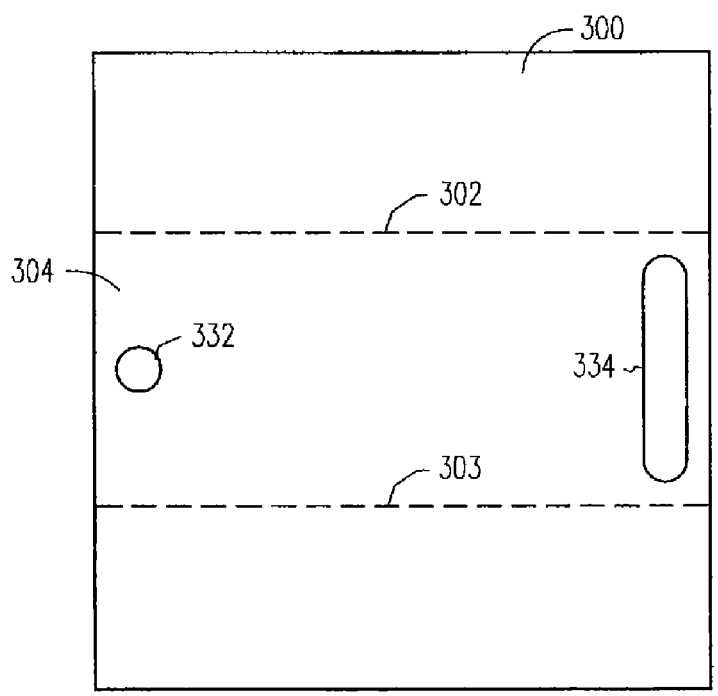
FIG. 12 illustrates a top view of the partially fabricated IHS shown in FIG. 11.

FIG. 12 illustrates a top view of the partially fabricated IHS 300 shown in FIG. 11. Partial hole 332 is round, while partial hole 334 is oblong. The round partial hole 332 should be properly sized to fit the injection nozzle (225, FIG. 6) of the injection machine. The oblong partial hole should be properly sized to fit the vacuum nozzle (254, FIG. 6) according to the amount of vacuum required to rid the semi-solid metallic material of entrapped air. Partial holes 332 and 334 are in the surface of partially fabricated IHS 300 towards the viewer. The surface away from the viewer comprises channel 304, which has channel boundaries 302 and 303.

Although in this fabrication sequence, the channel 304 is described as being formed prior to punching partial holes 332 and 334, in another embodiment, the channel could be formed concurrently with or following the formation of partial holes 332 and 334.

Figure 13:
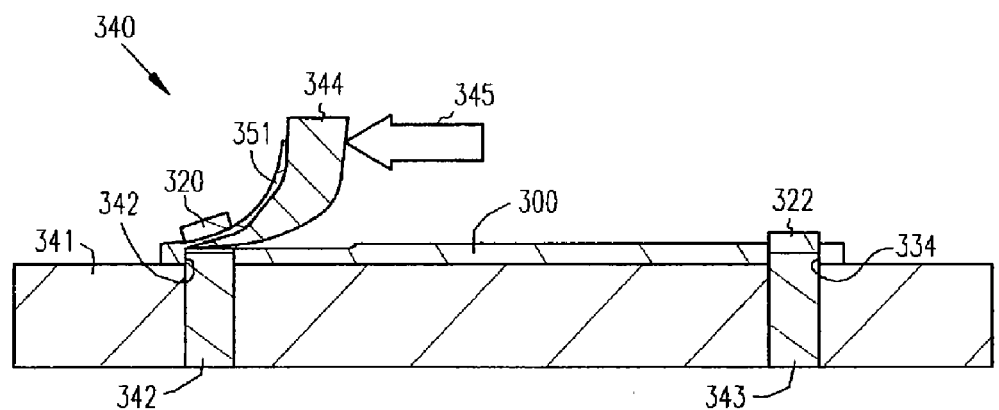
FIG. 13 illustrates a cross-sectional representation of a skiving tool of a skiving machine being employed on the partially fabricated IHS shown in FIG. 12, in accordance with one embodiment of the invention.

FIG. 13 illustrates a cross-sectional representation of a skiving tool 344 of a skiving machine 340 being employed on the partially fabricated IHS 300 shown in FIG. 12, in accordance with one embodiment of the invention. Skiving machine 340 comprises a base 341 having raised mounts 342 and 343. From the orientation shown in FIG. 11, partially fabricated IHS 300 is inverted and positioned on the base 341 so that raised mounts 342 and 343 fit into partial holes 332 and 334, respectively.

Skiving tool 344 is driven in the direction indicated by arrow 345, and it peels up inlet ramp 351 from the upper surface of partially fabricated IHS 300. Skiving tool 344 cuts through partial hole 332, so that a complete hole is now formed, as viewed from the underside of partially fabricated IHS 300.

Figure 14:
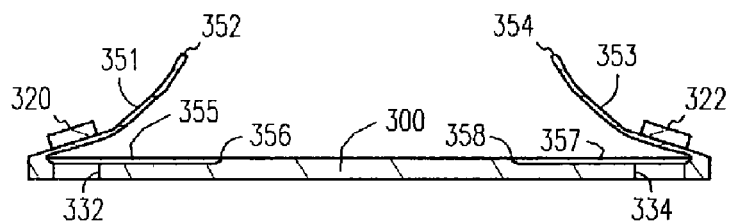
FIG. 14 illustrates a cross-sectional representation of an intermediate stage in the fabrication of a combination mold plate and IHS, in accordance with one embodiment of the invention.

In a similar operation, skiving tool 344 is rotated 180 degrees and moved in a direction opposite to that indicated by arrow 345 to peel up the outlet ramp 353 (refer to FIG. 14). Alternatively, the jig and partially fabricated IHS 300 could be rotated 180 degrees for this operation. Which element is moved with respect to another is not essential, and in various embodiments, these elements can be moved relative to each other in any suitable manner.

FIG. 14 illustrates a cross-sectional representation of an intermediate stage in the fabrication of a combination mold plate and IHS 300, in accordance with one embodiment of the invention. In FIG. 14, both sides of partially fabricated IHS 300 have undergone a skiving operation. Inlet ramp 351, including inlet ramp tip 352, are shown on the left-hand side of partially fabricated IHS 300, and outlet ramp 353, including outlet ramp tip 354, are shown on the right-hand side of partially fabricated IHS 300. Also seen in FIG. 14 is a depression 355 corresponding to the inlet ramp 351 lifted by the skiving blade. The entry point 356 made by the skiving blade, at the inlet ramp tip 352, is also shown. Similarly, a depression 357 and entry point 358 are shown for outlet ramp 353 and outlet ramp tip 354, respectively.

Figure 15:
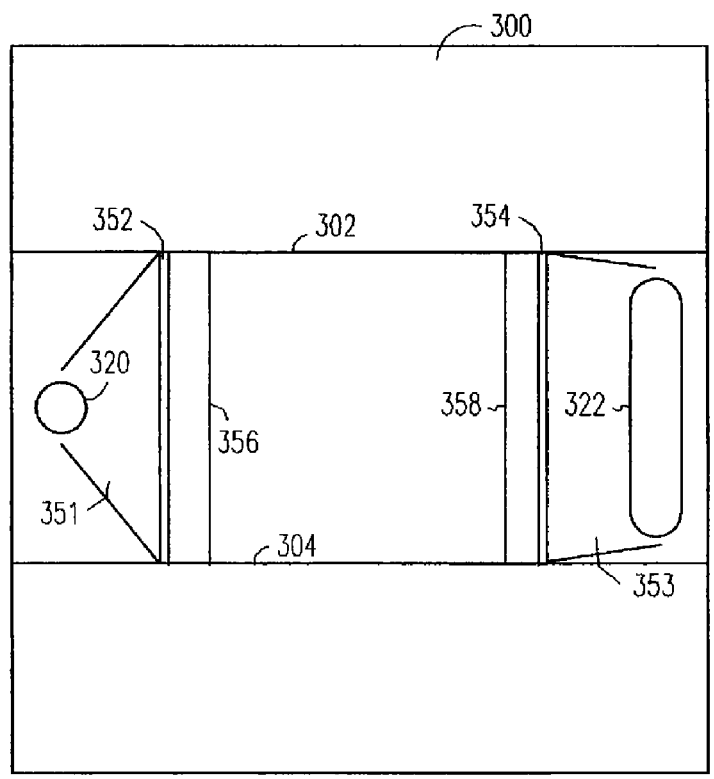
FIG. 15 illustrates a top view of the partially fabricated IHS shown in FIG. 14.

FIG. 15 illustrates a top view of the partially fabricated IHS 300 shown in FIG. 14. In FIG. 15 are seen the partially completed inlet ramp 351 and partially completed outlet ramp 353 extending outwardly towards the viewer.

Figure 16:
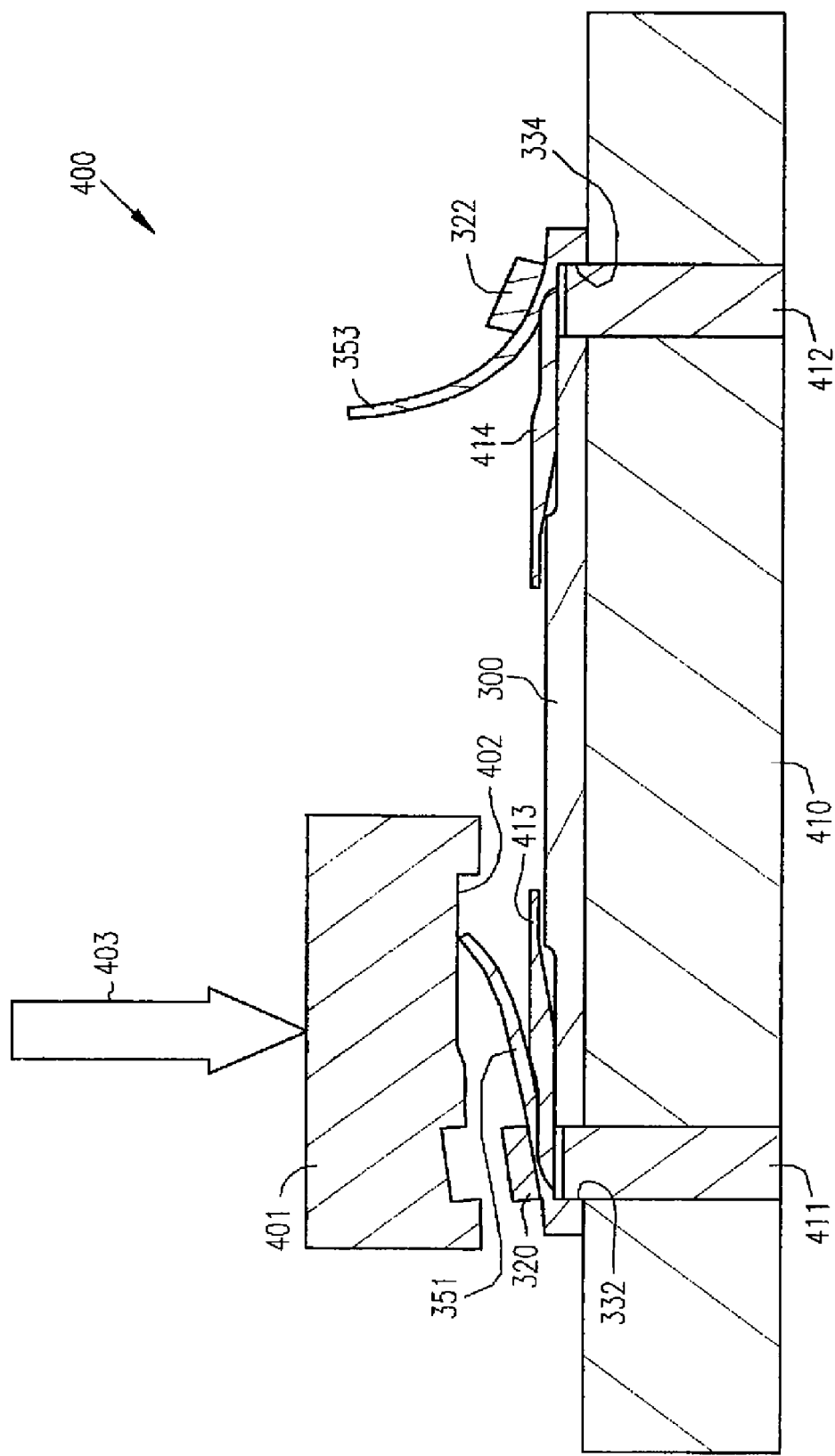
FIG. 16 illustrates a cross-sectional representation of a fabricating machine employing a stamping tool on the partially fabricated IHS shown in FIG. 12, in accordance with one embodiment of the invention.

FIG. 16 illustrates a cross-sectional representation of a fabricating machine 400 employing a stamping tool 401 on the partially fabricated IHS 300 shown in FIG. 14, in accordance with one embodiment of the invention. Fabricating machine 400 comprises a base 410 having raised mounts 411 and 412 that fit into holes 332 and 334, respectively, of partially fabricated IHS 300.

Stamping tool 401 comprises an embossed surface 402. A forming plate or spacing shoe 413 is placed under partially formed inlet ramp 351. Stamping tool 401 is then forced downward in the direction indicated by arrow 403. As a result, inlet ramp 351 is completely formed in the substantially planar shape indicated by inlet ramp 133 of IHS 120 (refer to FIG. 4).

Still referring to FIG. 16, in similar fashion, a forming plate or spacing shoe 414 is placed under partially formed outlet ramp 353, and an appropriately embossed stamping tool (not shown) is used to finish shaping outlet ramp 353 in the substantially planar shape indicated by outlet ramp 135 of IHS 120 (refer to FIG. 4).

Figure 17:
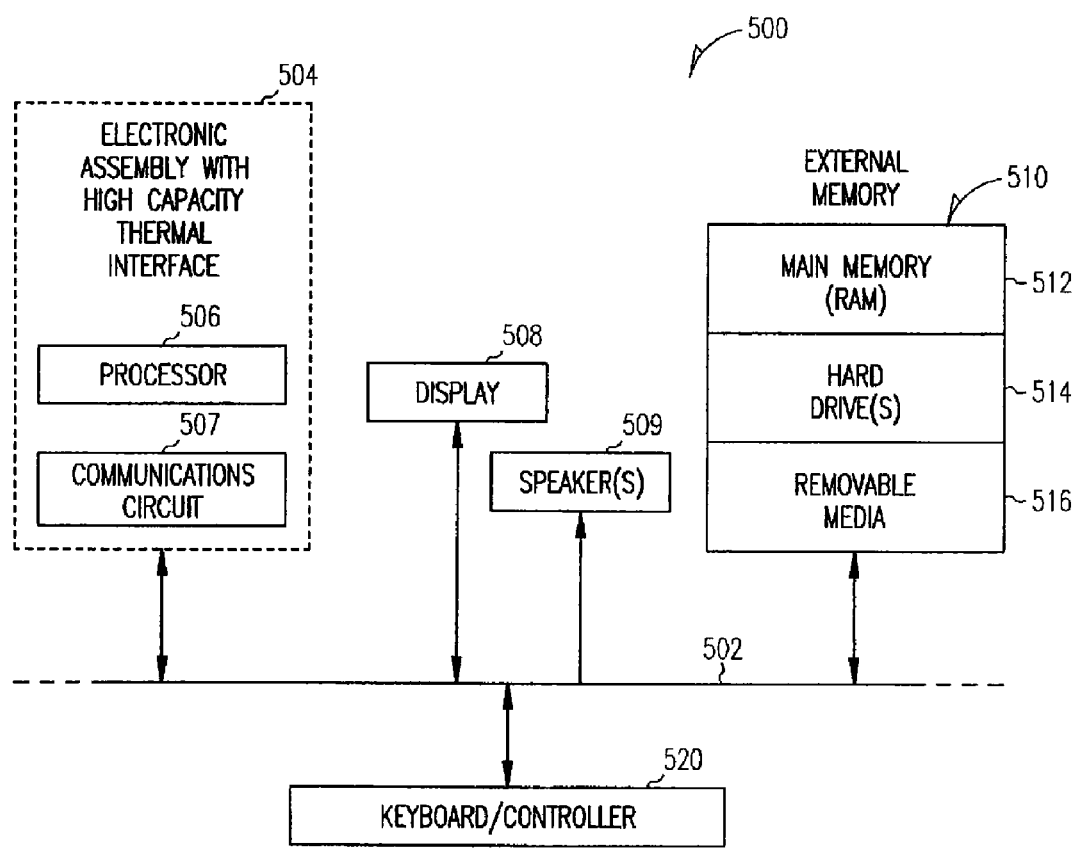
FIG. 17 is a block diagram of an electronic system incorporating at least one electronic assembly with a high capacity thermal interface in accordance with one embodiment of the invention.

FIG. 17 is a block diagram of an electronic system 500 incorporating at least one electronic assembly 504 with a high capacity thermal interface in accordance with one embodiment of the invention. Electronic system 500 is merely one example of an electronic system in which an embodiment of the invention can be used. In this example, electronic system 500 comprises a data processing system that includes a system bus 502 to couple the various components of the system. System bus 502 provides communications links among the various components of the electronic system 500 and can be implemented as a single bus, as a combination of busses, or in any other suitable manner.

Electronic assembly 504 is coupled to system bus 502. Electronic assembly 504 can include any circuit or combination of circuits. In one embodiment, electronic assembly 504 includes a processor 506 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 504 are a custom circuit, an application-specific integrated circuit (ASIC), or the like, such as, for example, one or more circuits (such as a communications circuit 507) for use in wireless devices like cellular telephones, pagers, portable computers, two-way radios, and similar electronic systems. Electronic assembly 504 can perform any other type of function. Electronic assembly 504 can comprise a single IC or multiple ICs.

Electronic system 500 can also include an external memory 510, which in turn can include one or more memory elements suitable to the particular application, such as a main memory 512 in the form of random access memory (RAM), one or more hard drives 514, and/or one or more drives that handle removable media 516 such as floppy diskettes, compact disks (CDs), digital video disk (DVD), and the like.

Electronic system 500 can also include a display device 508, one or more speakers 509, and a keyboard and/or controller 520, which can include a mouse, trackball, game controller, voice-recognition device, or any other device that permits a system user to input information into and receive information from the electronic system 500.

Figure 18:
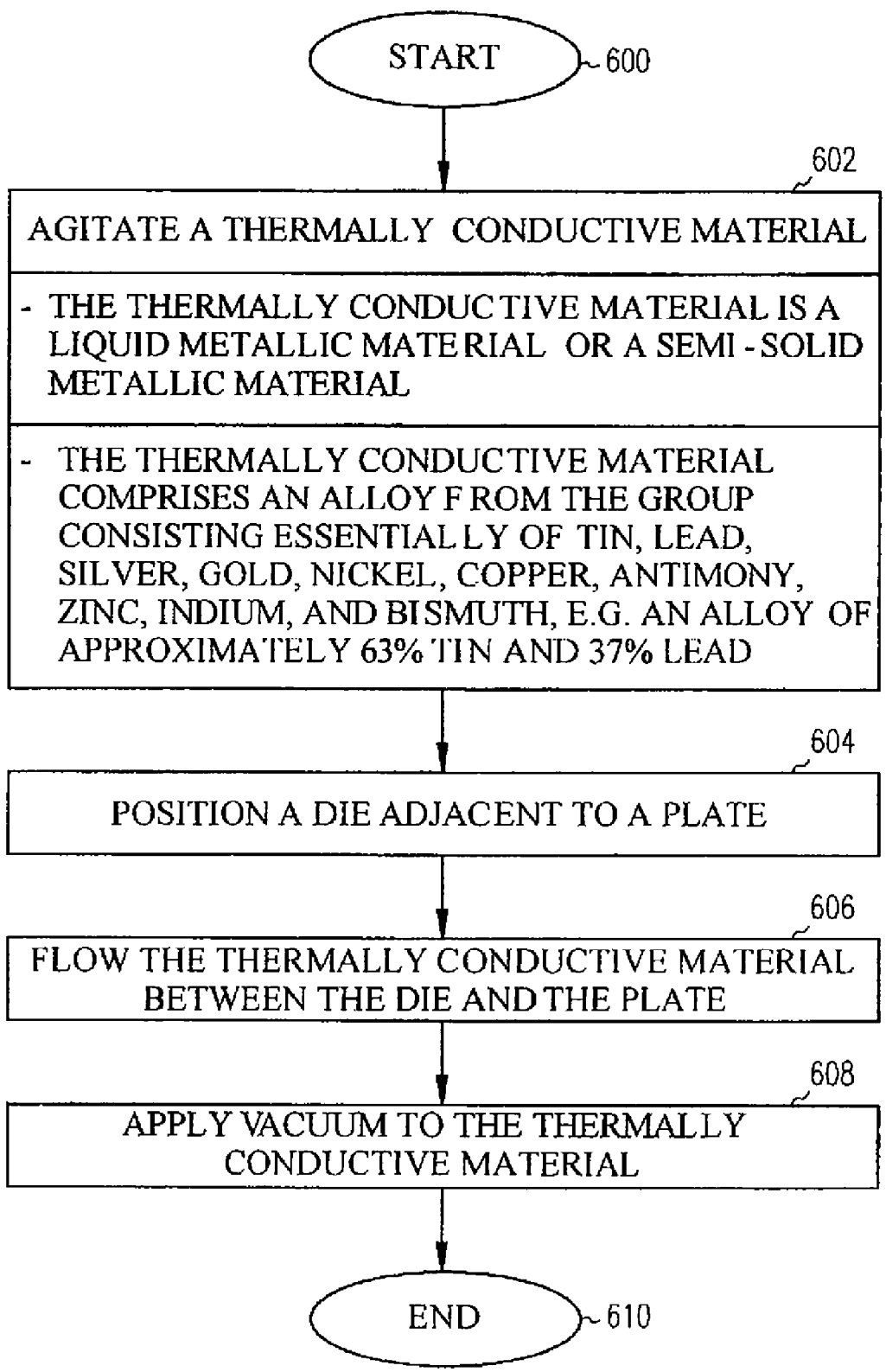
FIG. 18 is a flow diagram of a method of forming thermally conductive material between an IC and a plate, in accordance with one embodiment of the invention.

FIG. 18 is a flow diagram of a method of forming thermally conductive material between an IC and a plate, in accordance with one embodiment of the invention. The plate can be a combination mold plate and IHS, such as IHS 120 shown in FIGS. 3–5. The method starts at 600.

In 602, a thermally conductive material is agitated within an injection machine. The thermally conductive material can be a liquid metallic material or a semi-solid metallic material. The thermally conductive material can comprise an alloy from the group consisting essentially of tin, lead, silver, gold, nickel, copper, antimony, zinc, indium, bismuth, and gallium. In one embodiment, an alloy of approximately 63% tin and 37% lead is used. The thermally conductive material can also comprise a pure metal from the group consisting essentially of tin, lead, silver, gold, nickel, copper, antimony, zinc, indium, bismuth, and gallium, in which case the melting point can be expected to be higher than that of an alloy.

In 604, a die is positioned adjacent to a plate.

In 606, the thermally conductive material is flowed between the die and the plate.

In 608, vacuum is concurrently applied to the thermally conductive material to assist in flowing it between the die and the plate. In another embodiment, vacuum is applied before or after the thermally conductive material is flowed between the die and the plate. In yet another embodiment, vacuum is not used. The method ends at 610.

Figure 19A:
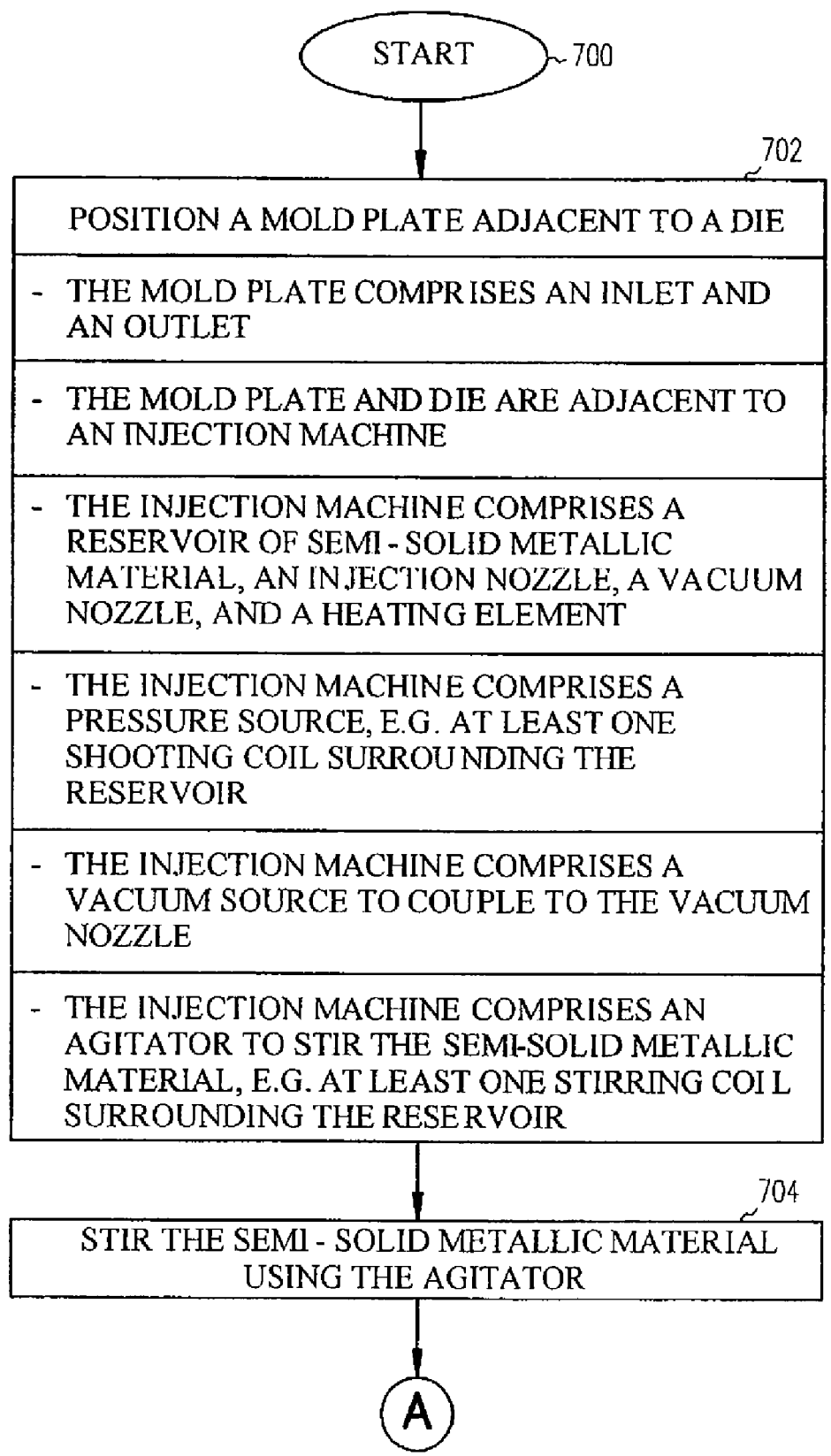
FIGS. 19A and 19B together illustrate a flow diagram of a method of operating a machine to form thermally conductive material between an IC and a mold plate, in accordance with one embodiment of the invention.
Figure 19B:
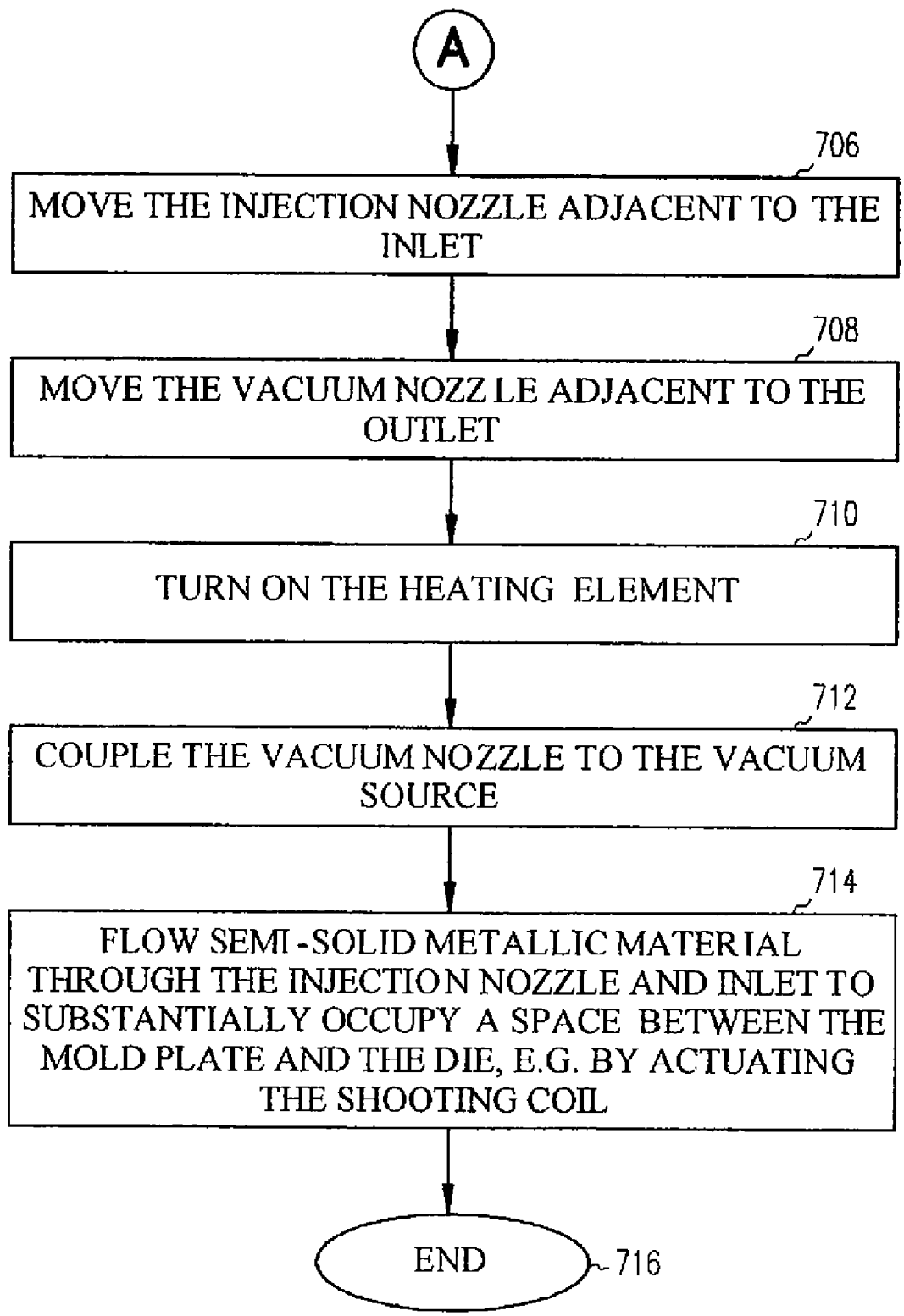

FIGS. 19A and 19B together illustrate a flow diagram of a method of operating a machine to form thermally conductive material between an IC and a mold plate, in accordance with one embodiment of the invention. The mold plate can be a combination mold plate and IHS, such as IHS 120 shown in FIGS. 3–5. The method starts at 700.

In 702, a mold plate is positioned adjacent to a die. The mold plate comprises an inlet and an outlet. The mold plate and die are adjacent to an injection machine. The injection machine comprises a reservoir of semi-solid metallic material, an injection nozzle, a suction or vacuum nozzle, and a heating element. The injection machine further comprises a pressure source. In one embodiment, the pressure source comprises a shooting coil surrounding the reservoir. The injection machine also comprises a vacuum source to couple to the vacuum nozzle. In addition, the injection machine comprises an agitator to stir the semi-solid metallic material. In one embodiment, the agitator comprises at least one stirring coil surrounding the reservoir.

In 704, the semi-solid metallic material is stirred using the agitator.

In 706, the injection nozzle is moved adjacent to the inlet.

In 708, the vacuum nozzle is moved adjacent to the outlet.

In 710, the heating element is turned on.

In 712, the vacuum nozzle is coupled to the vacuum source.

In 714, semi-solid metallic material is flowed through the injection nozzle and inlet to substantially occupy a space between the mold plate and the die. In one embodiment, this is carried out by activating a shooting coil to cause a piston to force the semi-solid metallic material through the injection nozzle. The method ends at 716.

The operations described above with respect to the methods illustrated in FIGS. 18, 19A, and 19B can be performed in a different order from those described herein. Further, some operations can be eliminated or combined with other operations. In addition, some operations may overlap with other operations.

FIGS. 1–16 are merely representational and are not drawn to scale. Certain proportions thereof may be exaggerated, while others may be minimized. FIGS. 2–19B are intended to illustrate various implementations of the invention that can be understood and appropriately carried out by those of ordinary skill in the art.

The above-described composition, geometry, dimensions, elements, and order of operations are merely exemplary of the embodiments illustrated, and they are not meant to be limiting. They can all be varied by one of ordinary skill in the art to optimize the thermal performance of the package, as well as the fabrication of the package.

For example, in place of a combination mold plate and IFS formed of copper, an IFS formed of diamond could be substituted. In such embodiment, an inlet and outlet would not necessarily be made in the IFS, and the semi-solid metallic material could be injected into one side of the cavity between the die and the IHS. Suitable restraints and/or molds could be employed to confine the semi-solid metallic material within the cavity between the upper surface of the die and the lower surface of the diamond IHS. Further, such restraints and/or molds could be used with an IHS formed of another type of material, such as copper or a copper alloy, in which case the IHS would not require an inlet, an outlet, an inlet ramp, or an outlet ramp.

In other embodiments, the combination mold plate and IHS can comprise other materials with thermal qualities that are only slightly inferior to diamond, such as a diamond composite, or graphite. A suitable diamond composite can comprise a mixture of diamond particles and particles of another substance, such as aluminum or copper.

An IHS fabricated of diamond, diamond composite, or graphite could have a suitable plating of metal, such as titanium, chromium, tungsten, or molybdenum, to enhance adhesion.

In addition, although a semi-solid metallic material has been described, a totally liquid metallic material could also be used in other embodiments.

Although a coil-operated piston arrangement has been disclosed as a pressure source in injection machine 200 (FIGS. 6 and 7), other suitable pressure sources could be substituted, such as a hydraulic or pneumatic pressure source, a cam or lever, or the like.

Further, the arrangement of stirring coils and shooting coils can be varied. For example, multi-function coils could be provided that perform both stirring and shooting. In another embodiment, one set of stirring coils could rotate the semi-solid metallic material in one direction, and another set of stirring coils could rotate it in the opposite direction. More or fewer stirring and/or shooting coils could be provided than are illustrated.

A rotating piston or a rotating internal rod could be used to stir the semi-solid metallic material.

The injection nozzle and vacuum nozzle could be coated with ceramic or other suitable material to reduce metal wetting and wear.

The embodiments of the invention provide for an electronic assembly and methods of manufacture thereof that minimize thermal dissipation problems associated with high power delivery. An electronic system and/or data processing system that incorporates one or more electronic assemblies that utilize the features of the present disclosure can handle the relatively high power densities associated with high performance integrated circuits, and such systems are therefore more commercially attractive.

By substantially increasing the thermal dissipation from high performance electronic assemblies, such electronic equipment can be operated at increased clock frequencies. Alternatively, such equipment can be operated at reduced clock frequencies but with lower operating temperatures for increased reliability.

As shown herein, the invention can be implemented in a number of different embodiments, including a combination mold plate and IHS, an electronic assembly, an electronic system in the form of a data processing system, a metallic material injection machine, and various methods of fabricating the combination mold plate and IHS, fabricating the electronic assembly, and operating the injection machine. Other embodiments will be readily apparent to those of ordinary skill in the art. The elements, materials, geometries, dimensions, and sequence of operations can all be varied to suit particular packaging requirements.

While certain operations have been described herein relative to "upper" and "lower" surfaces, "left" and "right", and "front" and "back", it will be understood that these descriptors are relative, and that they would be reversed if the IC package were inverted or rotated or mirrored. Therefore, these terms are not intended to be limiting.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the invention. Therefore, it is manifestly intended that the invention embodiments be limited only by the claims and the equivalents thereof.

What is claimed is:

1. A method comprising:
    positioning a die adjacent to a plate;
    flowing a thermally conductive thixotropic metal material between the die and the plate; and
    applying vacuum to the thermally conductive material.

2. The method recited in claim 1, wherein the thermally conductive material comprises an alloy from the group consisting of tin, lead, silver, gold, nickel, copper, antimony, zinc, indium, bismuth, and gallium.

3. The method recited in claim 1, wherein the thermally conductive material comprises an alloy of approximately 63% tin and 37% lead.

4. The method recited in claim 1 and further comprising before flowing:
    agitating the thermally conductive material.

5. A method comprising:
    positioning a die adjacent to a plate;
    flowing a thermally conductive thixotropic metal alloy material between the die and the plate; and
    applying vacuum to the thermally conductive material.

6. The method recited in claim 5 wherein the thermally conductive material comprises an alloy from the group consisting of tin, lead, silver, gold, nickel, copper, antimony, zinc, indium, bismuth, and gallium.

7. The method recited in claim 5 wherein the thermally conductive material comprises an alloy of approximately 63% tin and 37% lead.

8. The method recited in claim 5 and further comprising before flowing:
agitating the thermally conductive material.

9. A method comprising:
positioning a die adjacent to a plate, the die having a front surface comprising a plurality of terminals, and the die further having a back surface, which is adjacent to the plate; and
flowing a thermally conductive thixotropic metal alloy material between the die and the plate;
wherein the plate comprises an inlet, an outlet, an inlet ramp, and an outlet ramp, and wherein the inlet ramp extends from the inlet to the die, and wherein the outlet ramp extends from the die to the outlet.

10. The method recited in claim 9 wherein the plate comprises one of copper or a copper alloy.

11. The method recited in claim 9 wherein the plate comprises diamond.

12. The method recited in claim 9 wherein the plate comprises a channel having a dimension substantially equal to a dimension of the die.

13. The method recited in claim 9,
wherein the plate comprises a substantially planar upper surface and a lower surface comprising a die-fitting area having equivalent dimensions to those of the die, and having a pair of boundaries in physical contact with the die;
wherein the inlet is in the upper surface;
wherein the outlet is in the upper surface;
wherein the outlet ramp extends downwardly from the inlet to the die-fitting area and in physical contact with both the inlet and the die-fitting area; and
wherein the outlet ramp extends upwardly from the die-fitting area to the outlet and in physical contact with both the die-fitting area and the outlet.

14. The method recited in claim 13, wherein the plate further comprises a channel having a dimension substantially equal to a dimension of the die-fitting area.

15. The method recited in claim 13, wherein the plate is formed of material comprising one of copper, a copper alloy, and diamond.

16. The method recited in claim 13, wherein the die comprises a processor.

17. A method comprising:
positioning a die adjacent to a plate;
flowing a thermally conductive material from one of a liquid metallic material and a semi-solid metallic material between the die and the plate; and
applying vacuum to the thermally conductive material.

18. The method recited in claim 17, wherein the thermally conductive material comprises an alloy from the group consisting of tin, lead, silver, gold, nickel, copper, antimony, zinc, indium, bismuth, and gallium.

19. The method recited in claim 17 wherein the plate comprises an inlet, an outlet, an inlet ramp, and an outlet ramp, and wherein the inlet ramp extends from the inlet to the die, and wherein the outlet ramp extends from the die to the outlet.

20. A method comprising:
positioning a die adjacent to a plate;
flowing a thermally conductive material from one of a liquid metallic alloy material and a semi-solid metallic alloy material between the die and the plate; and
applying vacuum to the thermally conductive material.

21. The method recited in claim 20, wherein the thermally conductive material comprises an alloy from the group consisting of tin, lead, silver, gold, nickel, copper, antimony, zinc, indium, bismuth, and gallium.

22. The method recited in claim 20 wherein the plate comprises an inlet, an outlet, an inlet ramp, and an outlet ramp, and wherein the inlet ramp extends from the inlet to the die, and wherein the outlet ramp extends from the die to the outlet.

23. A method comprising:
positioning a die adjacent to a plate, the die having a front surface comprising a plurality of terminals, and the die further having a back surface, which is adjacent to the plate; and
flowing a thermally conductive material from one of a liquid metallic alloy material and a semi-solid metallic alloy material between the die and the plate;
wherein the plate comprises an inlet, an outlet, an inlet ramp, and an outlet ramp, wherein the inlet ramp extends from the inlet to the die, and wherein the outlet ramp extends from the die to the outlet.

24. The method recited in claim 23, wherein the thermally conductive material comprises an alloy of approximately 63% tin and 37% lead.

25. The method recited in claim 23, wherein the die comprises a processor.

* * * * *